United States Patent
Harvey et al.

(10) Patent No.: US 6,320,451 B1
(45) Date of Patent: Nov. 20, 2001

(54) STATIC POWER DIGITAL POTENTIOMETER

(75) Inventors: Arthur D. Harvey, Allen; Frank Duffey, Flower Mound, both of TX (US)

(73) Assignee: Dallas Semiconductor Corporation, Dallas, TX (US)

( * ) Notice: Subject to any disclaimer, the term of this patent is extended or adjusted under 35 U.S.C. 154(b) by 0 days.

(21) Appl. No.: 09/611,398

(22) Filed: Jul. 7, 2000

(51) Int. Cl.$^7$ ..................................................... G05F 1/00
(52) U.S. Cl. ........................................... 327/519; 307/36
(58) Field of Search .................................... 327/519, 594, 327/407; 307/36, 15, 38

(56) References Cited

U.S. PATENT DOCUMENTS

| | | | |
|---|---|---|---|
| 4,668,932 | 5/1987 | Drori et al. | 338/48 |
| 5,594,408 | 1/1997 | Ezell | 338/89 |
| 5,717,935 | 2/1998 | Zanders et al. | 395/750 |
| 5,913,181 | 6/1999 | Ezell | 702/65 |
| 5,923,159 | 7/1999 | Ezell | 323/354 |
| 6,046,932 | * 4/2000 | Bill et al. | 365/185.02 |
| 6,208,107 | * 3/2001 | Maske et al. | 318/685 |

OTHER PUBLICATIONS

R. H. Fowler and L. Nordheim, "Electron Emission in Intense Electric Fields," Proceedings of the Royal Society of London. A, vol. 119, pp. 173–181, 1928.

* cited by examiner

Primary Examiner—Jung Ho Kim
(74) Attorney, Agent, or Firm—Jenkens & Gilchrist, P.C.

(57) ABSTRACT

An improved method and system for providing power to digital potentiometers is provided by applying the static electric field of an adjacent modified, non-volatile memory cell to the wiper mechanism. During periods of power removal to the circuitry as a whole, the potentiometer maintains the selected resistance via this static power supply.

18 Claims, 3 Drawing Sheets

STATIC POWER DIGITAL POTENTIOMETER

BACKGROUND OF THE INVENTION

1. Field of the Invention

The present invention relates to electronic devices, and particularly semiconductor digital potentiometers.

2. Description of the Related Art

Various types of digital potentiometers for providing variable resistance have been known. Specifically, digital potentiometers are typically comprised of a resistor array with a plurality of selectable tap points electronically connected to a common terminal or "wiper." For each selectable tap point, there is a corresponding semiconductor gate device for switching a signal path through the gate device and into the resistor array at the specified tap point. semiconductor gate device for switching a signal path through the gate device and into the resistor array at the specified tap point.

Known digital potentiometers suffer from shortcomings, namely, they require electrical power to maintain their electrical characteristics. Inventions for resetting such electrical characteristics after a power outage have been proposed to compensate for this shortcoming. For example, Drori U.S. Pat. No. 4,668,932 and Zanders U.S. Pat. No. 5,717,935 have been proposed to use nonvolatile memory for storing and retrieving a value corresponding to a certain tap point (Drori) or control value (Zanders) of a potentiometer. When the power is restored Drori and Zanders retrieve a value from memory and use that value to reset the potentiometer's pre-outage electrical characteristics. These inventions employ variations of a technique which has long been familiar in the memory art, shadow RAM, where volatile memory is used for the primary memory, and a nonvolatile memory is used to backup the volatile memory.

There are at least three significant shortcomings to using shadow RAM. First, the technique merely restores what has been lost and does not prevent the loss from occurring. This shortcoming is particularly apparent in applications where power is or may be intermittent (e.g., in wireless phones and Personal Digital Assistants). Second, known digital potentiometers consume power while simply maintaining a wiper position, a waste of energy particularly where energy conservation is critical, as in, for example, battery-powered portable electronic equipment. Third, the technique employs recovery processes that require a recovery time which, depending on the application, may cause intolerable delays.

In these regards, the inventors herein have made a substantial improvement over the Drori, Zanders systems or other shadow RAM systems by using nonvolatile memory cells, not for storing a value, but for providing a static, nonvolatile power source to the potentiometer.

Examples of these improvements are evident in embodiments using a nonvolatile semiconductor memory cell which has not to the inventor's knowledge been used so as to provide power to a digital potentiometer, an EEPROM memory cell. The central part oaf classic EEPROM cell is typically a floating-gate transistor, i.e., a MOS transistor which has two gates stacked on top of each other, so that the two gates are capacitively coupled to each other and to a channel. One gate is called a "floating" gate, because it is electrically isolated. By injecting charges into the floating gate, the effective threshold voltage of the MOS transistor (as seen from the other gate) can be changed. This electrically isolated charge endures independently from the semiconductor's primary, volatile energy source.

In a preferred embodiment of the present invention, this isolated electrical source provides a constant charge for maintaining a selected resistance. In setting or unsetting the wiper to or from a given tap position, the floating gate of a corresponding nonvolatile memory cell, e.g., an EEPROM memory cell, is set by an electrical charge which, in turn, activates or deactivates an adjacent transistor which, in turn, forms or unforms a conductive channel between the corresponding wiper point in the resistor array and an output line. When a selected resistance is set, it is maintained statically by the isolated electrical field of the corresponding memory cell for as long as the corresponding memory cell maintains its setting regardless of power to the remainder of the circuitry.

SUMMARY OF THE INVENTION

The present invention overcomes the shortcomings and deficiencies noted above by providing a method and system that allows for a digital potentiometer to be statically powered. The present invention can be employed in a wide variety of systems contexts. Examples are volume, tone, fade, and balance controls in audio circuits and audio systems; contrast and brightness controls in video display terminals; hue and tint controls in television receivers, or many other applications. This invention can be particularly useful, for example, with remote controls and automotive accessory controls, where either energy or time conservation or both are at a premium.

A primary object of this invention is to provide a mechanism by which a semiconductor potentiometer's resistance selection endures through power outages to the remainder of the circuitry.

A further object of this invention is to use the energy fields of nonvolatile memory cells as a nonvolatile power source.

A further object of this invention is to eliminate extra steps and time needed in recovering a potentiometer's resistance value.

A further object of this invention is to conserve energy by statically maintaining a digital potentiometer's setting.

BRIEF DESCRIPTION OF THE DRAWINGS

Other advantages and novel features of the present invention can be understood and appreciated by reference to the following detailed description of the invention, taken in conjunction with the accompanying drawings in which.

DETAILED DESCRIPTION OF THE DRAWINGS PREFERRED EXEMPLARY EMBODIMENT

Figure 1:
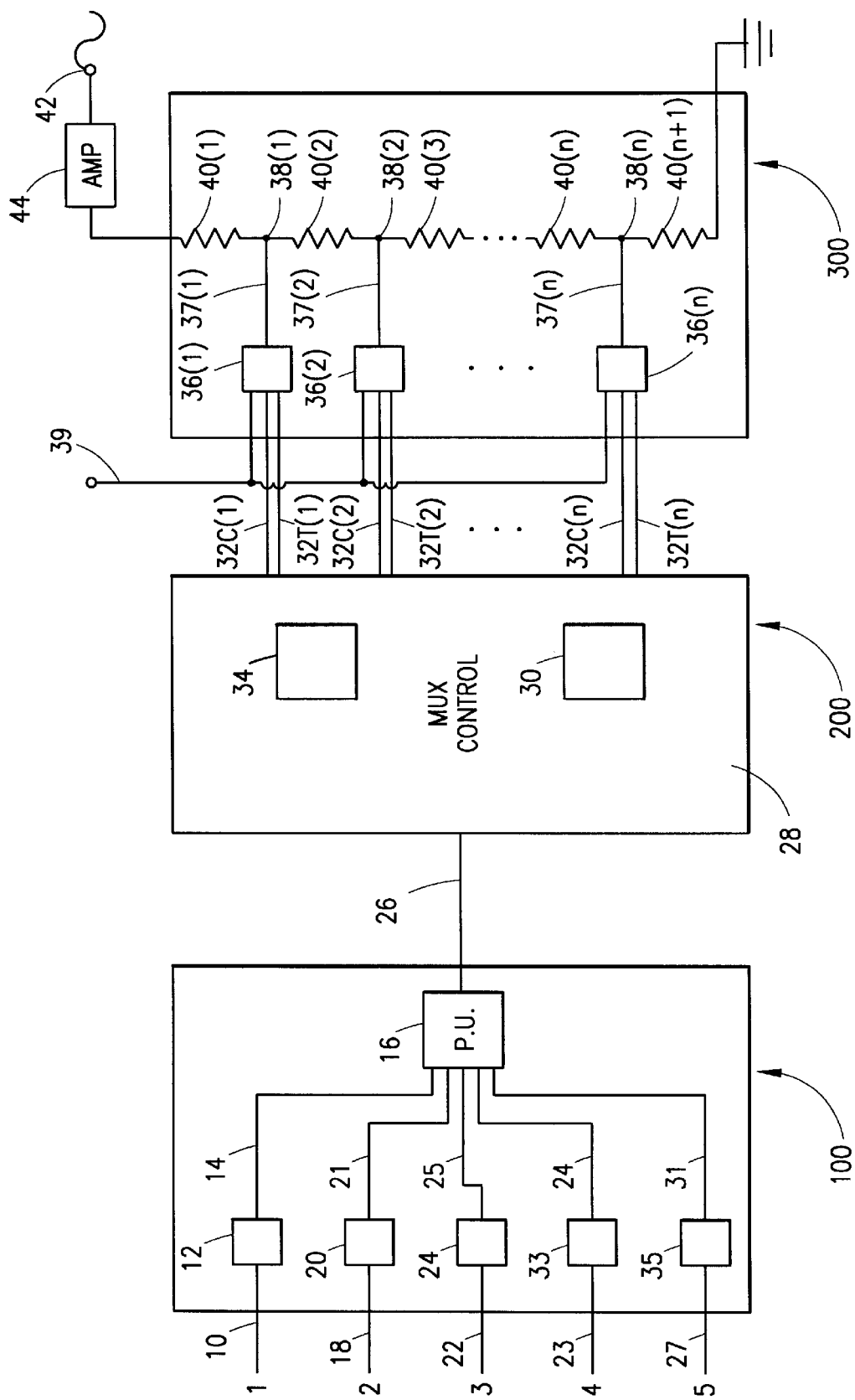
FIG. 1 is a block diagram overview of a system in which the invention maybe employed.

Applicant shows in FIG. 1 atypical example of how these types of devices are connected. Such an example is helpful to understand not only the nature of the prior art, but also applicant's invention. However, the actual connection is not critical to the understanding of this invention. Therefore, FIG. 1 is not shown for clarity but for contextual understanding.

As can be seen from FIG. 1, connections S1, S2, S3, S4 and S5 to external switches (1, 2, 3, 4 and 5, which are not shown explicitly) for clarity, are connected by lines 10, 18, 22, 23 and 27 to debounce circuits 12, 20, 24, 33 and 35 respectively which are within block 100. The debounce circuits 12, 20, 24, 33 and 35 can be conventional debounce circuits which would sense the open/close state of external switches 1, 2, 3, 4 and 5 and thereafter produce signals which reflect the state of the external switches 1, 2, 3, 4 and 5 over lines 14, 21, 25, 29, and 31 respectively to a processing unit 16. It should be understood that these switches 1–5 can be controlled manually or via software.

The processing unit 16 is adapted for analyzing the external switch selections to determine, for each oaf plurality of channels, whether the corresponding resistance of the digital potentiometer should be increased or decreased.

Processing unit 16 contains a circuit for interpreting the state of the external switches and an order of selection. More specifically, processing unit 16 continuously monitors lines 14, 21, 25, 29, and 31 coming from debounce circuits 12, 20, 24, 33 and 35 to determine for example whether an adjustment is being selected. Additionally, if two or more adjustments are being selected, then processing unit 16 determines which adjustment was selected first and responds to that selection while ignoring the other selections. If processing unit 16 determines that only one selection is being made, then the processing unit 16 will respond in a normal fashion.

In accordance with a selected interpretation of signal selections received, the processing unit 16 sends commands over line 26 to a multiplexer control or MUX control 28 located in block 200 to activate the multiplexer 30 and to select the resistive value produced by the potentiometer resistor array 40(1), 40(2), 40(3) ... 40(n) of block 300. The circuit for interpreting the commands produced by the processing unit 16 may, for example, be digital circuitry or in the form of a microprocessor under software control or a combination thereof.

In one embodiment, processing unit 16 will determine if switch 1, 2, 3, 4 or 5 is being selected, and if more than one switch 1, 2, 3, 4 or 5 is selected, then processing unit 16 will determine which switch was selected first. Accordingly, the processing unit 16 will issue corresponding control commands over line 26 to the MUX control 28.

When the MUX control 28 of block 200 receives a control command over line 26 from processing unit 16, it determines what action should betaken, if any. According to known digital potentiometers, the multiplexer control would activate by applying a predetermined voltage on one oaf plurality of singular lines to select the appropriate wiper position of the potentiometer. In a preferred embodiment of the present invention, the multiplexer control activates one oaf plurality of gate devices 36 through corresponding pairs of control lines 32C and tunnel lines 32T. In one embodiment, the potentiometer will have for example a resistor array having 64 logarithmic steps. Accordingly, there would be 64 control/tunnel pairs of lines, namely 32C(1)/32T(1) through 32C(64)/32T(64).

In the embodiment exemplified in FIG. 1, the MUX control device 28 activates one of the plurality of gate devices 36(1)–36(n) via a charge pump 34 in MUX Control 28. The charge pump 34 provides a voltage level adapted for activating and deactivating gate devices 36 in one of multiple alternative embodiments. In one embodiment, agate device is activated by applying a high voltage on the corresponding 32C line and a ground or relatively low voltage on the corresponding 32T line. All other gate devices are deactivated by applying ground or relatively a low voltage on the 32C lines and a high voltage on the 32T lines corresponding to those other gates. In such embodiment, the potentiometer will have for example a resistor array having 64 logarithmic steps. Accordingly, there would be 64 pairs of multiplexer control lines, namely 32C(1)/32T(1) through 32C(64)/32T(64). Thus, to activate a gate device 36(1) and deactivate all other gate devices 36(2)–36(64), a charge pump 34 in MUX Control 28 would apply high voltage to lines 32C(1) and 32T(2)–(64), and would apply a ground or relatively low voltage to lines 32T(1) and 36(2)–36(64). It should be understood that, in an alternate exemplary embodiment, the MUX Control 28 may be programmed to activate and deactivate specific gate devices 36 by applying appropriate voltages on specific selected lines 32C/32T.

Figure 2:
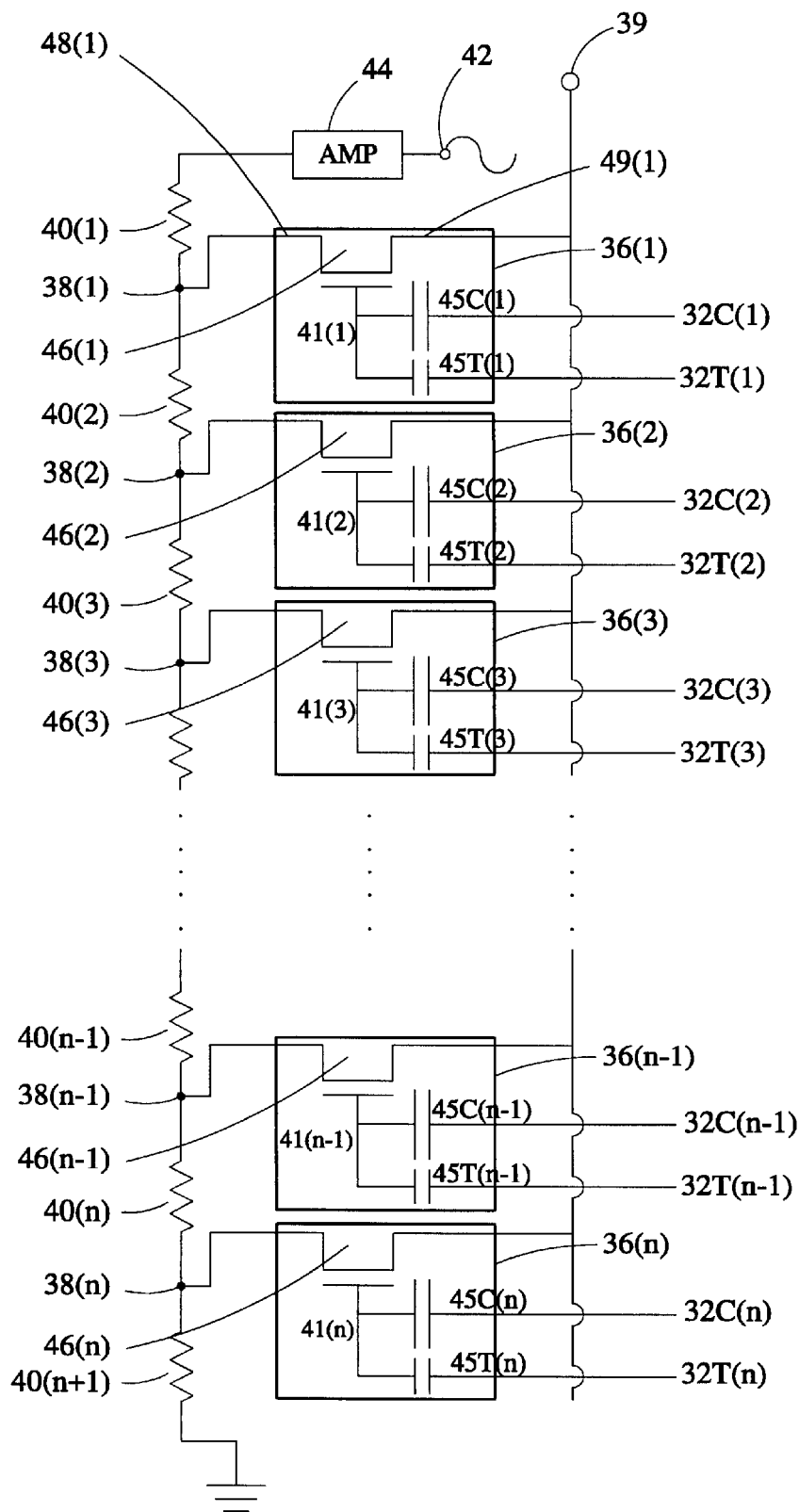
FIG. 2 is a schematic of one embodiment of the invention.

Referring now to FIG. 2, a more detailed schematic of one embodiment of a gate device 36 with a standard EEPROM memory cell is discussed.

Figure 3:
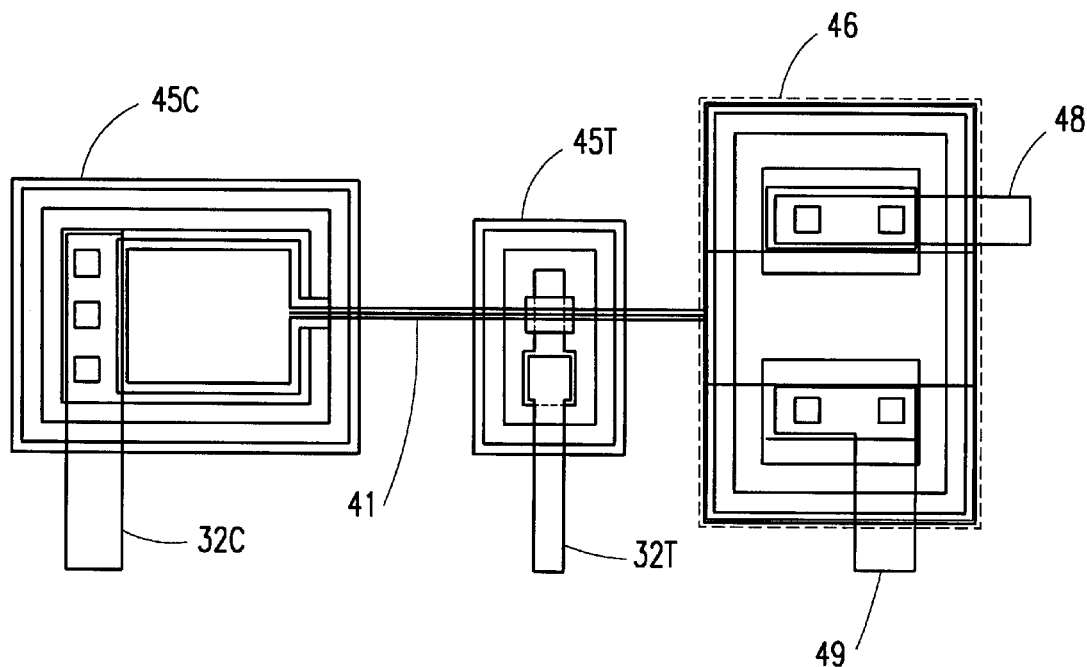
FIG. 3 is an exemplary overhead view of the gates and sense transistor embodied in the invention.

A general overview of what comprises a gate device 36 reveals a channel gate 45C and a tunnel gate 45T, each of which may be activated or deactivated by the placement of appropriate voltages on lines 32C and 32T, respectively. The control gate 45C and tunnel gate 45T are separated from a floating gate 41 by a layer of insulation 50. The floating gate is, in turn, separated from a silicon-based sense transistor 46 by a layer of insulation 50. Each end of the sense transistor 46 has metal contacts; the wiper contact 48 is connected to a wiper point 38 and the output contact 49 is connected to an output line 39. An alternate illustration from an overhead perspective is found in FIG. 3.

A charge is imparted to or removed from a floating gate 41 by altering the electrical characters of the control gate 45C and tunnel gate 45T via the insulation 47. To impart a charge allocating gate 41, the corresponding tunnel gate 45T is charged for a specified duration with a positive voltage and the corresponding channel gate 45C is grounded. Conversely, to remove a charge from a floating gate 41, the corresponding channel gate 45C is charged for a specific duration with a positive voltage and the corresponding tunnel gate 45T is grounded.

How much voltage is to be applied and for how long to the tunnel gate 45T or the channel gate 45C varies with each system's physical character and geometry. In the exemplary embodiment described herein, a voltage on the order of 15V applied for a duration on the order of 20 to 30 milliseconds has provided satisfactory results.

The selection of the insulator 50 positioned between the floating gate 41 and the control 45C and tunnel 45T gates is governed or influenced by these voltage and duration levels. Preferably, the selected insulation 50 can withstand to a practical utilitarian extent the gradual wear and tear explained by the Fowler-Nordheim theory well-known in the art of EEPROM memory cells. See, e.g., R. H. Fowler and L. Nordheim, "Electron Emission in Intense Electric Fields," Proc. Roy. Soc. London. A, vol. 119, pp. 173–181, 1928. By standards of current technology, a floating gate may be charged and discharged approximately 50,000 times before this wear-out condition occurs. Good results have been obtained with several insulators. Examples of insulators that have worked well include silicon dioxide, nitrate, aluminum oxide, and an emerging variety of organic insulators. An exemplary preferred embodiment describe herein prefers a silicon dioxide insulator as the insulator 47.

When a sufficient voltage is applied for a sufficient duration to either the tunnel gate 45T($x$) or the control gate 45C($x$), and the other is concurrently grounded, the floating gate is consequently left with a negative or positive charge, respectively. In inventive applications the objective of which is to set only one wiper point 38, a preferred embodiment of the invention involves a scheme by which a floating gate 41 corresponding to the selected wiper point 38 is either negatively charged and all other floating gates 41 are positively charged, or positively charged and all other floating gates 41 are negatively charged. Which of these alternative schemes is selected is optional but, as discussed further, will determine the character of the adjacent sense transistors 46.

On a sense transistor 46 adjacent to a corresponding floating gate 41, the discrete areas of the surface closest to the adjacent floating gate 41 are doped with a pattern of physical properties which, depending upon the electrical state of the adjacent floating gate 41, render the area between the metal contacts 48, 49 of the sense transistor 46 electrically conductive or nonconductive.

Figure 4:
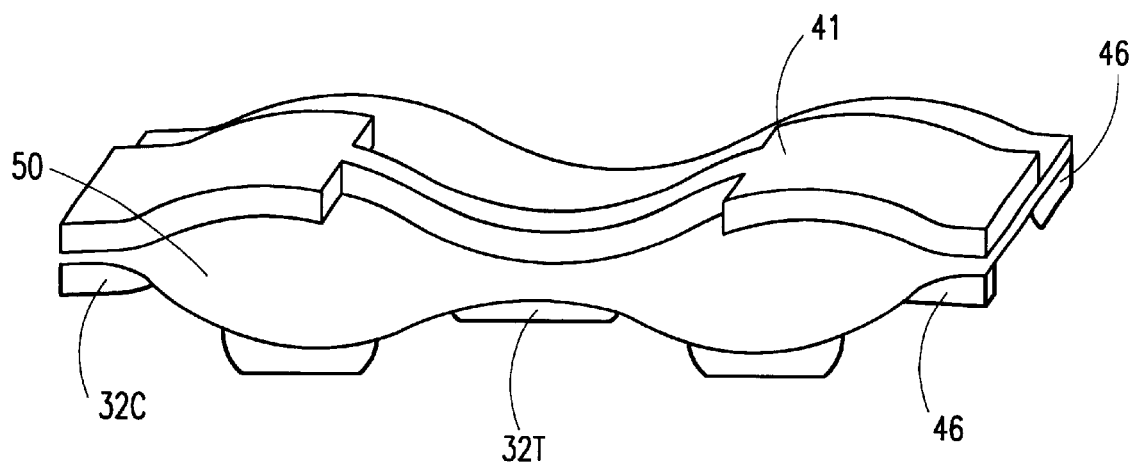
FIG. 4 is an exemplary side view of the gates, insulator and sense transistor embodied in the invention.

Referring now to FIG. 4, in an exemplary and preferred embodiment of the present invention wherein a floating gate 41 corresponding to the selected wiper point 38 is negatively charged and all other floating gates 41 are positively charged, the surface area between the metal contacts of the sense transistors 46 are comprised of an area of n-type phosphorous between areas of p-type boron. When a floating gate 41 is negatively charged, the excess electrons of the n-type phosphorous are drawn away from the surface of the sense transistor 46 and into the insulating substrate 50. Consequently, the area of n-type phosphorous assumes a p-type character and, surrounded by areas of matter also of a p-type character, creates an electrically conductive surface area between the metal contacts of the sense transistor 46.

It should be understood that an alternate embodiment is possible, wherein a floating gate 41 corresponding to a selected wiper point 38 is positively charged and all other floating gates 41 are negatively charged. In such an embodiment, the surface area between the metal contacts 48, 49 of the sense transistors 46 are comprised of an area of p-type boron between areas of n-type phosphorous. When a floating gate 41 is positively charged, the electrons flow towards the surface of the sense transistor 46. Consequently, the area of type boron assumes an n-type character and, surrounded by areas of matter also of an n-type character, creates an electrically conductive surface area between the metal contacts 48, 49 of the sense transistor 46.

Once the surface area of the sense transistor becomes electrically conductive, a conductive path is maintained between the wiper tap 38 and output line 39 and the desired change in system 44 is achieved—for example, if such device is being used in the context of an audio amplifier then the desired volume or change in volume is achieved. It is worth noting that in one embodiment of the invention, the processing unit 16 has the ability to "step" the resistance values from the original wiper selection to the final wiper selection, over a given time period to produce a gradual increase in the desired volume so as to avoid instantaneous change, if the change called for is sufficient to justify or require such stepping. This may be desired so as to prevent to rapid a change in volume, for example.

A further more detailed description of the generalized operation of the digital potentiometer found in filed U.S. Pat. No. 5,923,159 entitled "Logarithmic Taper Resistor" with zero crossing changes for which the full description and operation are incorporated by reference herein. Other improvements to this structure can be found in Ezell, "Zero Crossing Detector" and Ezell, "Stereo Control", incorporated by reference herein and bearing application Ser. Nos. 08/497,301 and 08/497,490, respectively.

Although a preferred embodiment of the method and apparatus of the present invention has been illustrated in the accompanying drawings and described in the foregoing Detailed Description, it will be understood that the present invention is not limited to the embodiments disclosed, but is capable of numerous rearrangements, modifications, and substitutions, without departing from the spirit and scope of the invention as set forth and defined by the following claims.

What is claimed is:

1. A digital potentiometer system comprising:

an array of resistors having a number of resistors;

an array of transistors wherein the number of transistors in the array are equal in number to the said number of resistors in said array of resistors, wherein each transistor in said array of transistors is connected on a first end to a resistor in said array of resistors and on a second end to an output line; and a plurality of floating gates wherein at least one is adjacent to each of said transistors in said array of transistors;

wherein static power is provided to said digital potentiometer by placing an activating electrical charge on at least one of said floating gates so as to activate the transistor which is adjacent to said floating gate, so as to form a conductive channel from an individual resistor in said array of resistors connected to an individual transistor, through said individual transistor, and into the output line.

2. A system as in claim 1 wherein said activating electrical charge is negative.

3. A system as in claim 1 wherein said activating electrical charge is positive.

4. A system as in claim 1 further comprising:

nonconductive channels between all other resistors in said array of resistors and said output line; and wherein said nonconductive channels are formed when each transistor connected to each of said all other resistors in said array of resistors is deactivated by a deactivating electrical charge on the floating gate adjacent to said each transistor.

5. A system as in claim 4 wherein said deactivating electrical charge is positive.

6. A system as in claim 4 wherein said deactivating electrical charge is negative.

7. A system as in claim 1 wherein each transistor in said array of transistors is comprised of a surface area in close proximity to said floating gate, said surface area located between two metal contacts and doped with a first discrete area isolated between second and third discrete areas.

8. A system as in claim 7 wherein said doping is of a first type and of a second type.

9. A system as in claim 8 wherein said first discrete area is doped with said first type and said second and third discrete areas are doped with said second type.

10. A system as in claim 9 wherein said first type comprises n-type phosphorous and said second type comprises p-type boron.

11. A system employing a digital potentiometer, said digital potentiometer comprising:

an array of resistors;

an array of transistors, wherein each transistor in said array of transistors is connected on a first end to a resistor in said array of resistors and on a second end to an output line; and a floating gate adjacent to each said transistor;

wherein static power is provided to said digital potentiometer by placing an activating electrical charge on a floating gate to activate the transistor adjacent to said floating gate so as to form a conductive channel from an individual resistor in said array of resistors connected to an individual transistor, through said individual transistor, and into the output line.

12. A system as in claim 11 further comprising:
a battery for powering said system.

13. A system as in claim 11 further comprising:
an audio circuit.

14. A system as in claim 11 further comprising:
a video display terminal.

15. A system as in claim 11 further comprising:
a television receiver.

16. A system as in claim 11 further comprising:
a remote control.

17. A system as in claim 11 further comprising:
an automotive accessory control.

18. A method for providing static power to a digital potentiometer comprising the steps of:

connecting an array of transistors to an array of resistors and an output line, wherein each transistor in said array of transistors is connected on a first end to a resistor in said array of resistors and on a second end to said output line;

placing a floating gate adjacent to each said transistor; and placing an activating electrical charge on a floating gate, whereby said electrical charge activates the transistor adjacent to said floating gate to form a conductive channel from the resistor in said array of resistors connected to said transistor, through the transistor, and into said output line.

* * * * *